(12) United States Patent
Tran et al.

(10) Patent No.: US 9,647,035 B2
(45) Date of Patent: May 9, 2017

(54) NON-VOLATILE RESISTIVE RANDOM ACCESS MEMORY CROSSBAR DEVICES WITH MAXIMIZED MEMORY ELEMENT DENSITY AND METHODS OF FORMING THE SAME

(71) Applicant: GLOBALFOUNDRIES Singapore Pte. Ltd., Singapore (SG)

(72) Inventors: Xuan Anh Tran, Singapore (SG); Eng Huat Toh, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/858,387

(22) Filed: Sep. 18, 2015

(65) Prior Publication Data

US 2016/0087197 A1 Mar. 24, 2016

Related U.S. Application Data

(60) Provisional application No. 62/052,003, filed on Sep. 18, 2014.

(51) Int. Cl.
*H01L 27/24* (2006.01)
*H01L 45/00* (2006.01)

(52) U.S. Cl.
CPC ...... *H01L 27/2409* (2013.01); *H01L 27/2463* (2013.01); *H01L 45/04* (2013.01); *H01L 45/1226* (2013.01); *H01L 45/146* (2013.01); *H01L 45/16* (2013.01); *H01L 45/1666* (2013.01)

(58) Field of Classification Search
CPC .. H01L 45/1233; H01L 45/1666; H01L 45/16
See application file for complete search history.

(56) References Cited

U.S. PATENT DOCUMENTS

2011/0128779 A1* 6/2011 Redaelli ............... G11C 13/00
365/163

* cited by examiner

*Primary Examiner* — Tran Tran
*Assistant Examiner* — Trang Tran
(74) *Attorney, Agent, or Firm* — Lorenz & Kopf, LLP

(57) ABSTRACT

Non-volatile resistive random access memory crossbar devices and methods of fabricating the same are provided herein. In an embodiment, a non-volatile resistive random access memory crossbar device includes a crossbar array including a bitline and a wordline. A hardmask that includes dielectric material is disposed over the bitline. The hardmask and the bitline include a first sidewall. A memory element layer and a selector layer are disposed in overlying relationship on the first sidewall of the bitline and hardmask. The memory element layer and a selector layer are further disposed between the bitline and the wordline, to form a first memory element and selector pair.

18 Claims, 8 Drawing Sheets

NON-VOLATILE RESISTIVE RANDOM ACCESS MEMORY CROSSBAR DEVICES WITH MAXIMIZED MEMORY ELEMENT DENSITY AND METHODS OF FORMING THE SAME

CROSS-REFERENCE TO RELATED APPLICATIONS

This application claims the benefit of U.S. Provisional Application No. 62/052,003, filed Sep. 18, 2014.

TECHNICAL FIELD

The technical field generally relates to non-volatile resistive random access memory (RRAM) crossbar devices and methods of forming the same. More particularly, the technical field relates to non-volatile RRAM crossbar devices with maximized memory element density and methods of forming such devices.

BACKGROUND

Various types and configurations of non-volatile random access memory device have been developed, with a continued drive to minimize device size and maximize memory element density within the devices. Many emerging memory elements have a two-terminal structure and are configured as a 1-transistor-1-memory element (1T1M) cell. In the 1T1M cells, access transistor footprint generally dominates device size design constraints, with memory elements generally having significantly smaller dimensions than the access transistors. For example, various memory elements may have a footprint of about $4F^2$, where F represents Minimum Feature Size and is commonly employed as a unit of measure for memory elements. However, many access transistors have a footprint that is significantly higher than $4F^2$, with some access transistors having a footprint of up to $100F^2$ or larger due to transistor layout and current requirements.

Given the generally larger footprint of access transistors as compared to memory elements, memory device architecture has been developed to enable multiple memory elements to share a single access transistor. For example, crossbar arrays (CBAs) have been proposed for increasing density of memory elements while maintaining the 1T1M cell configuration. With sharing of the single access transistor and shared electrical connections between memory elements, current leakage paths exist between the memory elements, with leakage current passing through non-selected memory elements. In particular, "current leakage", as referred to herein, refers to loss of current through non-selected memory elements and bitline interconnections due to the interconnected relationship of the non-selected memory elements, selected memory elements, wordline connections, and bitline connections. As a result, a signal for a selected memory element may be obscured due to the loss of leakage current through the other connected memory elements.

To minimize current leakage, selectors are generally disposed in series with the memory elements. The memory elements and the selectors are generally fabricated in a stacked configuration between terminal electrodes, with the terminal electrodes and memory element/selector stack disposed between a word line and a bit line to form a junction. The selectors function to minimize leakage current by increasing on-current requirements for the junction, thereby blocking passage of current at levels below the necessary on-current for the memory element/selector pair. However, effectiveness of the selectors is generally related to surface area of the selectors with the memory element. Thus, as feature size of the memory elements decreases, corresponding decreases in surface area of the selectors results in lower on-current requirements for the junction. As such, current leakage generally becomes more problematic as feature size decreases.

Accordingly, it is desirable to provide non-volatile random access memory device and methods of forming the same with maximized memory element density and with minimized current leakage between memory elements. Furthermore, other desirable features and characteristics of the present invention will become apparent from the subsequent detailed description, taken in conjunction with the accompanying drawings and this background.

BRIEF DESCRIPTION OF THE DRAWINGS

The various embodiments will hereinafter be described in conjunction with the following drawing figures, wherein like numerals denote like elements, and wherein.

BRIEF SUMMARY

Figure 1:
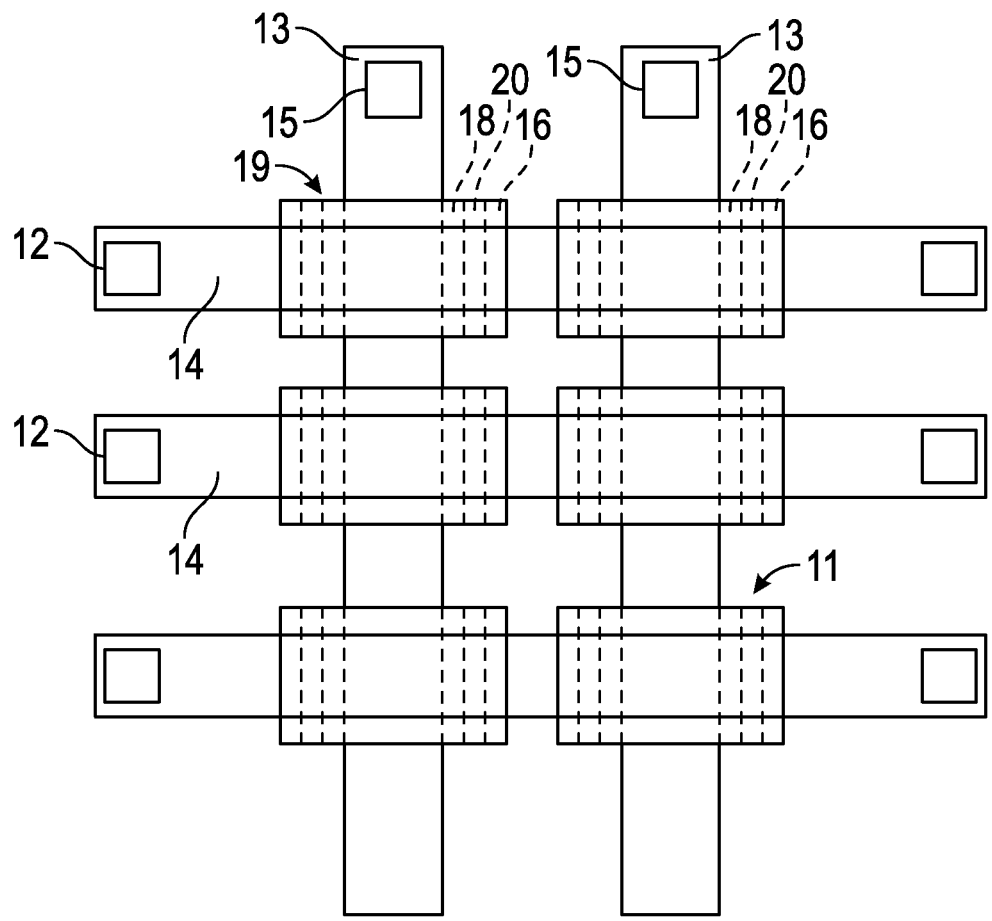
FIG. 1 is a top schematic view of a non-volatile resistive random access memory (RRAM) crossbar device including a crossbar array in accordance with an embodiment.

Non-volatile resistive random access memory crossbar devices and methods of fabricating the same are provided herein. In an embodiment, a non-volatile resistive random access memory crossbar device includes a crossbar array including a bitline and a wordline. A hardmask that includes dielectric material is disposed over the bitline. The hardmask and the bitline include a first sidewall. A memory element layer and a selector layer are disposed in overlying relationship on the first sidewall of the bitline and hardmask. The memory element layer and a selector layer are further disposed between the bitline and the wordline, to form a first memory element and selector pair.

In another embodiment, a non-volatile resistive random access memory crossbar device includes a crossbar array including a first bitline, a first wordline, and a second wordline. A hardmask includes dielectric material and is disposed over the first bitline. The hardmask and the first bitline include a first sidewall and a second sidewall on an opposing side of the hardmask and first bitline from the first sidewall. A first memory element and selector pair is disposed on the first sidewall of the first bitline and hardmask, and is further disposed between the first bitline and the first wordline. A second memory element and selector pair is disposed on the second sidewall of the first bitline and hardmask, and is further disposed between the first bitline and the second wordline.

In another embodiment, a method of fabricating a non-volatile resistive random access memory crossbar device includes patterning a bitline with an overlying hardmask over a first dielectric layer. A memory element layer and a selector layer are formed over a first sidewall of the bitline and hardmask to form a first memory element and selector pair.

A second dielectric layer is formed over the first dielectric layer and adjacent to the bitline and the memory element layer, provided that a portion of the memory element layer over the first sidewall remains exposed after forming the second dielectric layer. A wordline is formed over the over the second dielectric layer and the exposed portions of the memory element layer.

DETAILED DESCRIPTION

The following detailed description is merely exemplary in nature and is not intended to limit the invention or the application and uses of the devices and methods of forming the same. Furthermore, there is no intention to be bound by any theory presented in the preceding background or the following detailed description.

Non-volatile resistive random access memory (RRAM) crossbar devices and methods of forming the non-volatile RRAM crossbar devices are provided herein. For the sake of brevity, conventional techniques related to RRAM crossbar device fabrication may not be described in detail herein. Moreover, the various tasks and process steps described herein may be incorporated into a more comprehensive procedure or process having additional steps or functionality not described in detail herein. In particular, various steps in the manufacture of RRAM crossbar devices are well-known and so, in the interest of brevity, many conventional steps will only be mentioned briefly herein or will be omitted entirely without providing the well-known process details. Further, it is noted that RRAM crossbar devices include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper," "over," "lower," "under," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

The non-volatile RRAM crossbar devices include a crossbar array that includes a bitline and a wordline with a memory element and selector pair disposed at a junction between the bitline and the wordline. However, instead of being disposed on top of the bitline and fabricated vertically thereover, the memory element and selector pair is disposed over sidewalls of the bitline and hardmask that overlies the bitline to provide a lateral junction between the bitline and wordline. In particular, the hardmask is disposed over the bitline to form a fin-like structure, with the memory element and selector pair formed over a sidewall of the bitline and the hardmask. With the memory element and selector pair disposed over the sidewall of the bitline and hardmask, surface area of the selector with the memory element can be varied without impacting memory element density of the non-volatile RRAM crossbar device, since memory element density is controlled by lateral dimensions of the memory element and selector and not by vertical dimensions. Thus, even with decreasing lateral dimensions of the bitline and overlying hardmask, vertical dimensions may be increased to ensure that sufficient surface area between the selector and the memory element may be maintained to avoid unwanted current leakage between memory element and selector pairs at different junctions within the non-volatile RRAM crossbar devices.

Figure 2:
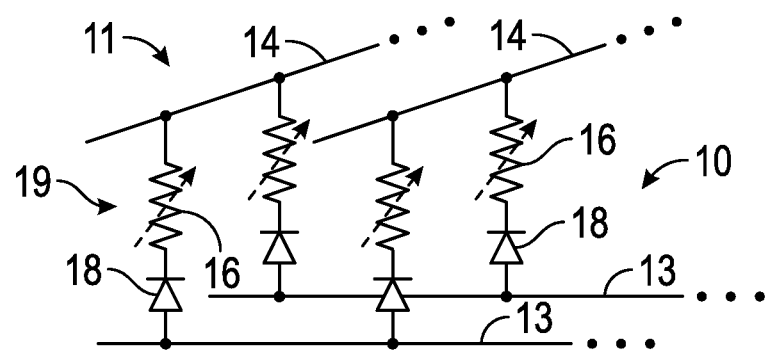
FIG. 2 is a schematic diagram of a non-volatile RRAM crossbar device including a crossbar array with memory element and selector pairs disposed at crossbar junctions in accordance with the embodiment of FIG. 1.
Figure 3:
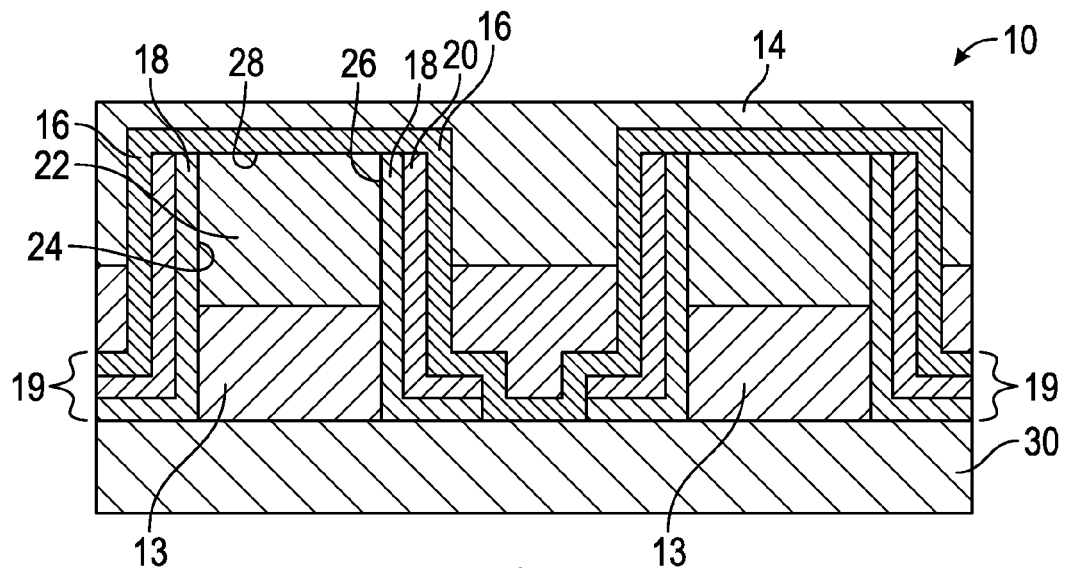
FIGS. 3-4(h) are schematic cross-sectional side views of a portion of a non-volatile RRAM crossbar device including memory element and selector pairs disposed between a wordline and a bitline and a method of fabricating the same in accordance with the embodiment of FIG. 1.

Referring to FIGS. 1-3, an embodiment of a non-volatile resistive RAM (RRAM) crossbar device 10 will now be described. In embodiments, the non-volatile RRAM crossbar device 10 includes a crossbar array 11 that includes a bitline 13 and a wordline 14, with the wordline 14 disposed over the bitline 13. Access transistors 12 are in electrical communication with the wordline 14, and access transistors 15 are in electrical communication with the bitline 13. It is to be appreciated that while FIG. 1 shows three wordlines 14 and two bitlines 13, additional wordlines 14 and bitlines 13 may be present with yet additional access transistors 12 in electrical communication with the additional wordlines 14 and with yet additional access transistors 15 in electrical communication with the additional bitlines 13, with the number of wordlines and bitlines dependent upon application requirements (e.g., embedded memory or stand-alone type). Size of the access transistors may vary depending upon memory elements connected thereto and the current requirements of the memory elements. For example, in embodiments, the access transistors have a footprint, i.e., cover an area in the device, of from about $6F^2$ to about $100F^2$, such as from about 10 to about $100F^2$, such as from about 50 to about $100F^2$, where F represents Minimum Feature Size and is a unit of measure for memory elements included in the device.

A memory element layer 16 and a selector layer 18 are disposed in overlying relationship on a sidewall of the bitline 13, and an electrode layer 20 may be disposed over the selector layer 18. The wordline 14 functions as a top electrode, with a RRAM cell including the memory element layer 16, the electrode layer 20 as a bottom electrode, and the wordline 14 as a top electrode. While other configurations of the memory element layer, the selector layer, and the electrode layer are possible, in the embodiment shown in FIG. 1, the selector layer 18 is disposed directly over and on the sidewall of the bitline 13, the electrode layer 20 is disposed directly over and on the selector layer 18, and the memory element layer 16 is disposed directly over and on the electrode layer 20 (i.e., the bottom electrode layer of RRAM cell).

In embodiments and referring to FIG. 2, each junction between bitlines 13 and wordlines 14 effectively includes a single memory element and selector pair 19, which forms a RRAM cell at each junction. Referring to FIG. 3, the configuration of the single memory element and selector pair 19 at each junction between the bitlines 13 and wordlines 14 is shown in further detail. As shown in FIG. 3, bitlines 13 are disposed over a first dielectric layer 30. A hardmask 22 is disposed over the bitline 13, and the hardmask 22 and the bitline 13 include a first sidewall 24. The memory element layer 16 and the selector layer 18 are disposed over the first sidewall 24 of the hardmask 22 and bitline 13, and are further disposed between the bitline 13 and the wordline 14, to form the RRAM cell. Additionally, in this embodiment, the hardmask 22 and the bitline 13 further include a second sidewall 26 on an opposing side of the hardmask 22 and the bitline 13 from the first sidewall 24. The memory element layer 16 and the selector layer 18 are further disposed over the second sidewall 26 of the bitline 13 and hardmask 22. To provide the one memory element and selector pair configuration at each junction in this embodiment, the memory element layer 16 is further disposed over a top surface 28 of the hard mask 22, with the memory element layer 16 continuous over the first sidewall 24, the top surface 28 of the hardmask 22, and the second sidewall 26. The selector layer 18 is discontinuous over the top surface 26 of the hard mask 22. With the selector layer 18 disposed over both the first sidewall 24 and the second sidewall 26, effective surface area between the selector layer 18 and the memory element layer 16 is double as compared to configurations where the selector layer 18 and memory element layer 16 are only on one sidewall of the bitline 13 and hardmask 22.

The bitlines 13 and wordlines 14 are formed from electrically conductive material such as copper. The first dielectric layer 30 and the hardmask 22 are formed from dielectric material. The memory element layer 16, which may also be referring to as a resistive switching layer, may include one or more distinct layers of different material, and suitable materials for the memory element layer 16 include those that can be switched under application of current. In embodiments, the memory element layer 16 is formed from a transition metal oxide (TMO), examples of which include but are not limited to hafnium oxide, zirconium oxide, tantalum oxide, titanium oxide, nickel oxide, copper oxide, aluminum oxide, aluminum oxynitride, or any other type of switching material known for RRAM applications. The selector layer 18 may include one or more distinct layers of different material and represents a resistive layer of a selector that provides relatively high resistance at relatively low voltages of typical leakage current. In embodiments, selector layer 18 is a resistive layer of a diode. Examples of suitable selector configurations include p-n junctions and metal Schottky junctions. Examples of p-n junction diode selectors that may be used include oxide-based or metal silicon p-n junctions. Examples of metal Schottky junctions that may be used employ semiconducting oxides in the selector layer 18. The electrode layer 20 is used as a bottom electrode for the RRAM cell.

Figure 4A:
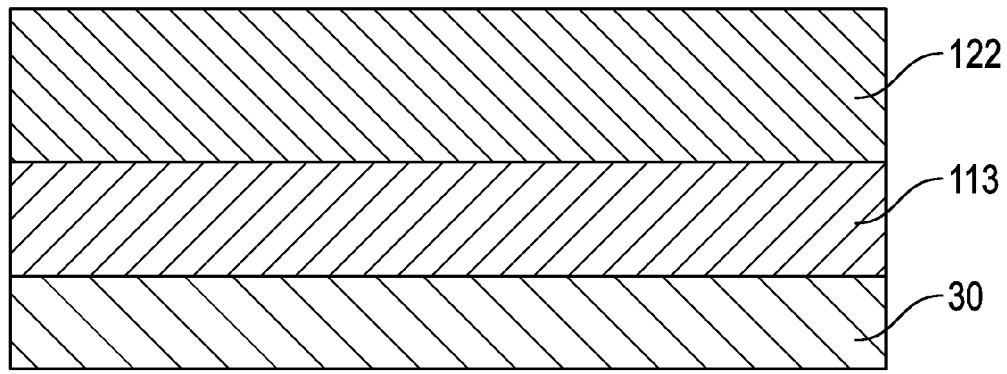
Figure 4B:
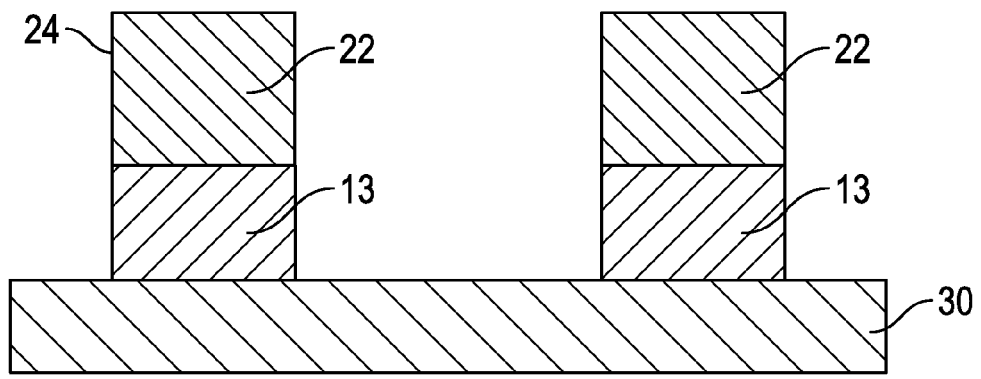
Figure 4C:
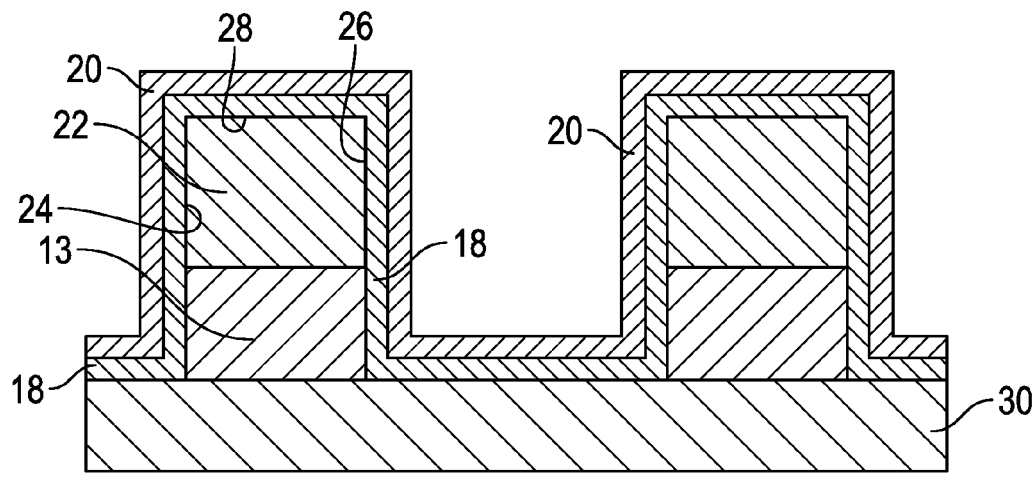
Figure 4D:
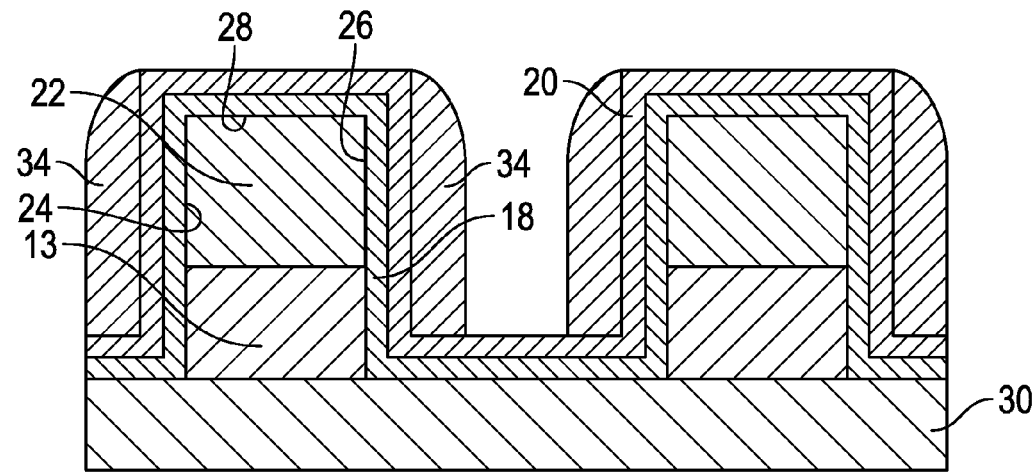
Figure 4E:
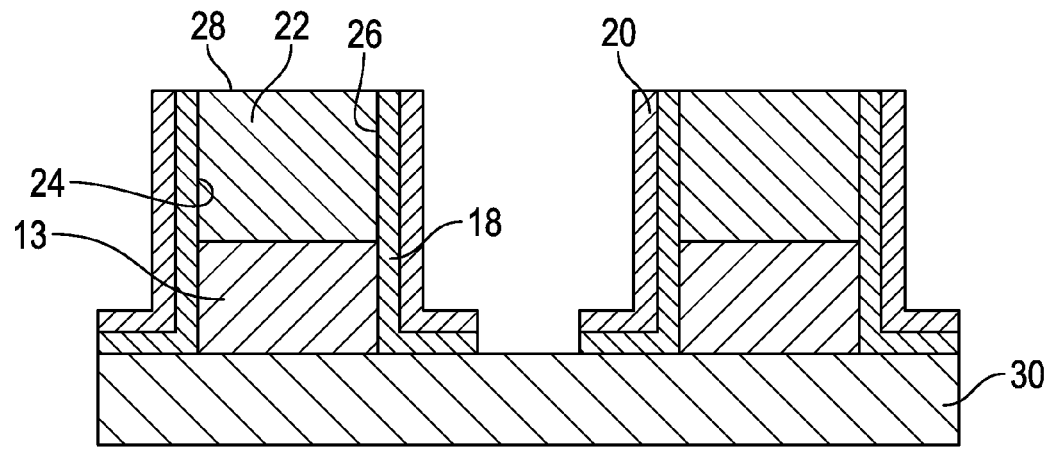
Figure 4F:
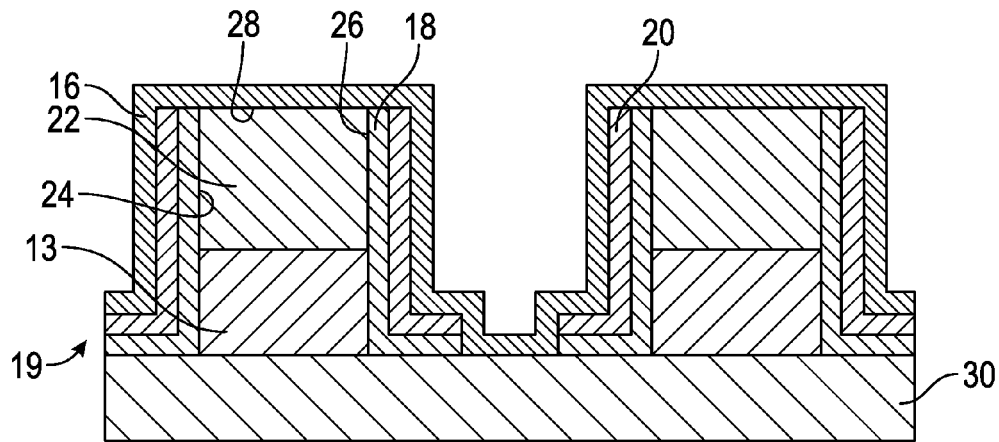
Figure 4G:
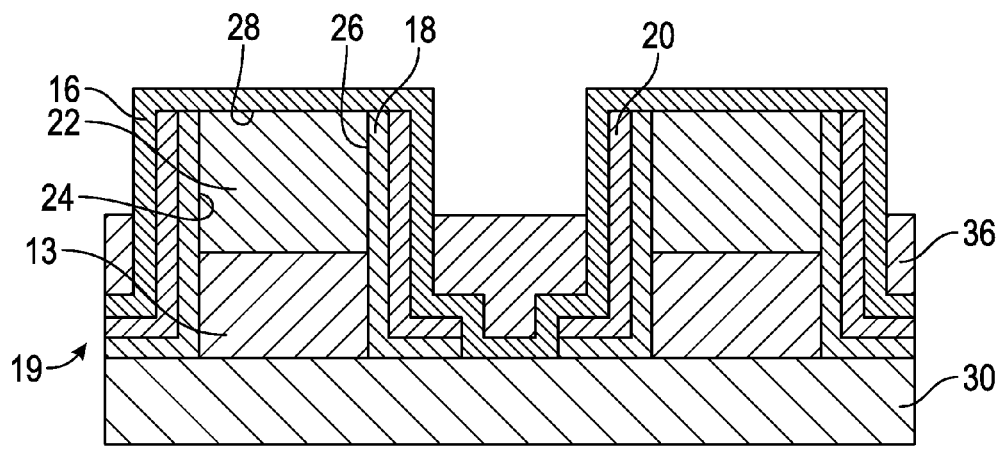
Figure 4H:
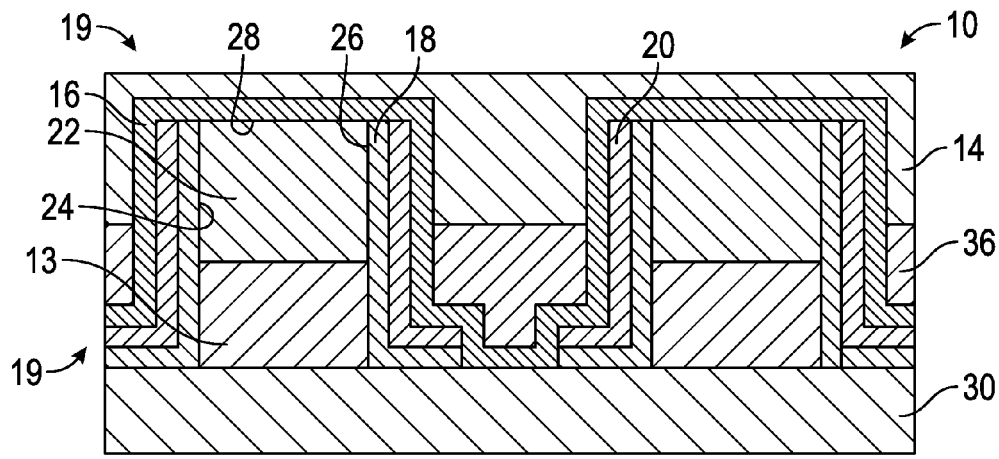

A method of forming the non-volatile RRAM crossbar device 10 of FIGS. 1 and 3 will now be described with reference to FIGS. 4(a)-4(h). Referring to FIG. 4(a), a bitline layer 113 and a hardmask layer 122 are formed over the first dielectric layer 30. Referring to FIG. 4(b), the bitlines 13 with the overlying hardmask 22 are patterned over the first dielectric layer 30, e.g., using conventional patterning techniques such as lithography and etching using an appropriate etchant for the materials of the hardmask layer and the bitline layer. Referring to FIG. 4(c), the selector layer 18 and the first electrode layer 20 are selectively formed over portions of the first sidewall 24 of the bitline 13 and hardmask 22. Additionally, the selector layer 18 and the first electrode layer 20 are selectively formed over the second sidewall 26 of the bitline 13 and hardmask 22, and over the top surface 28 of the hardmask 22. The selector layer 18 and the first electrode layer 20 may be formed through patterned deposition techniques to be located in areas where the wordlines 14 are to be formed over the bitlines 13. Referring to FIG. 4(d), sidewall spacers 34 are formed over the electrode layer 20 adjacent to the first sidewall 24 and the second sidewall 26, with spacing provided between sidewall spacers 34 of adjacent bitline 13 and hardmask 22 structures. Referring to FIG. 4(e), the electrode layer 20 and the selector layer 18 are etched from the top surface 28 of the hardmask 22 and from between sidewall spacers 34 of adjacent bitline 13 and hardmask 22 structures for isolation purposes, with the sidewall spacers subsequently removed. Referring to FIG. 4(f), the memory element layer 16 is formed through, e.g., a patterned deposition technique over the electrode layer 20 (i.e., bottom electrode), top surface 28 of the hardmask 22, and over the first dielectric layer between adjacent bitline 13 and hardmask 22 structures. In this embodiment, the memory element layer 16 is formed after forming the selector layer 18 and the electrode layer 20, which is suitable under conditions where the selector layer 18 and/or the electrode layer 20 are formed at temperatures that may compromise the memory element layer 16, although it is to be appreciated that in other embodiments and as described in further detail below, the selector layer and the electrode layer may be formed over the memory element layer, i.e., the memory element layer may first be formed over the first sidewall followed by forming the selector layer and the electrode layer over the memory element layer. In the embodiment of FIG. 4(f), the memory element layer 16 along with the electrode layer 20 and selector layer 18 over both the first sidewall 24 and the second sidewall 26 form a first memory element and selector pair 19. Referring to FIG. 4(g), a second dielectric layer 36 is formed over the first dielectric layer 30 and adjacent to the bitline 13 and the memory element layer 16, provided that a portion of the memory element layer 16 over the first sidewall 24 remains exposed after forming the second dielectric layer 36. Additionally, the second dielectric layer 36 is formed with a thickness greater than that of the bitline 13. Referring to FIG. 4(h), the wordline 14 is formed over the second dielectric layer 36 and the exposed portions of the memory element layer 16.

Figure 5:
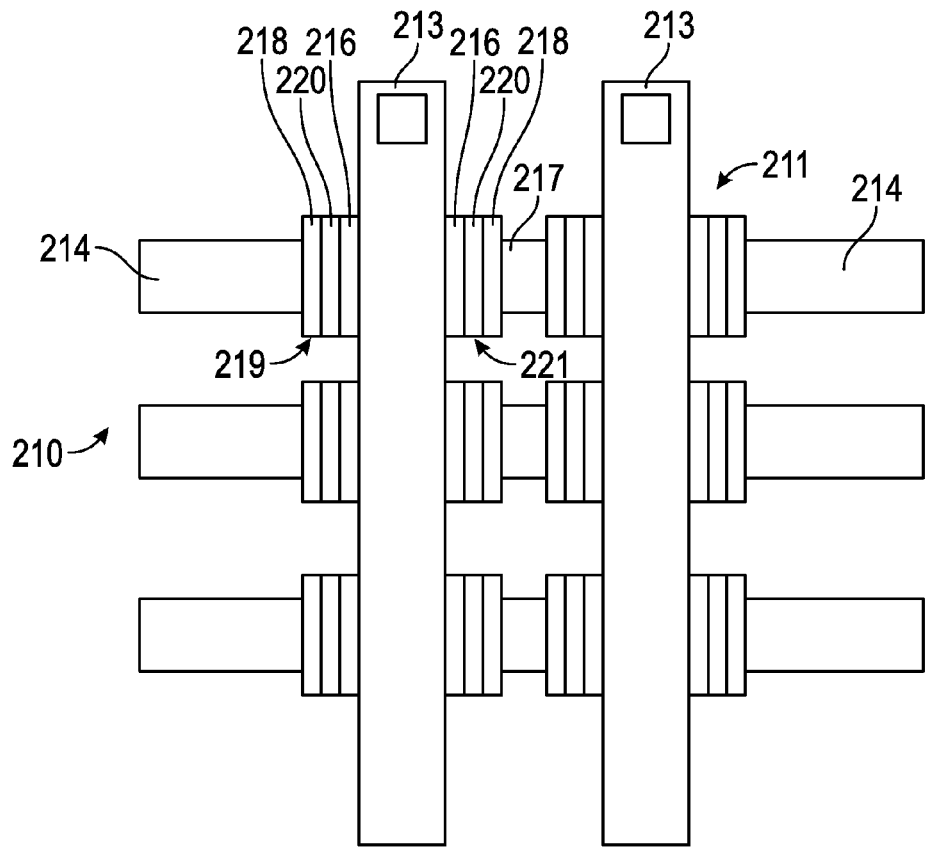
FIG. 5 is a top schematic view of a non-volatile RRAM crossbar device including a crossbar array in accordance with another embodiment.
Figure 6:
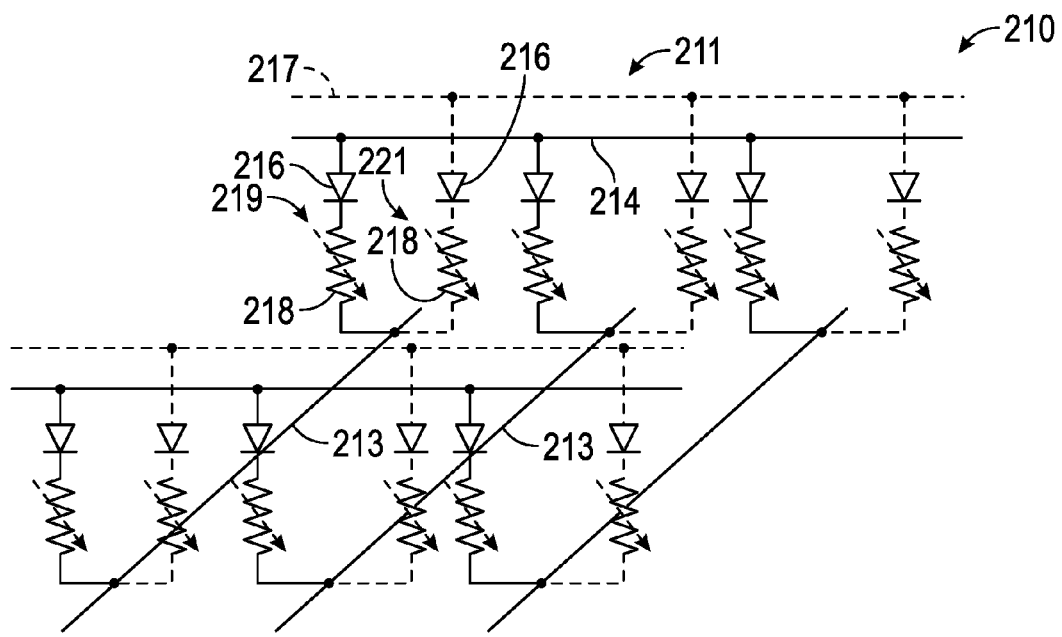
FIG. 6 is a schematic diagram of a non-volatile RRAM crossbar device including a crossbar array with two memory element and selector pairs disposed at crossbar junctions between a single bitline and two wordlines in accordance with the embodiment of FIG. 5.
Figure 7:
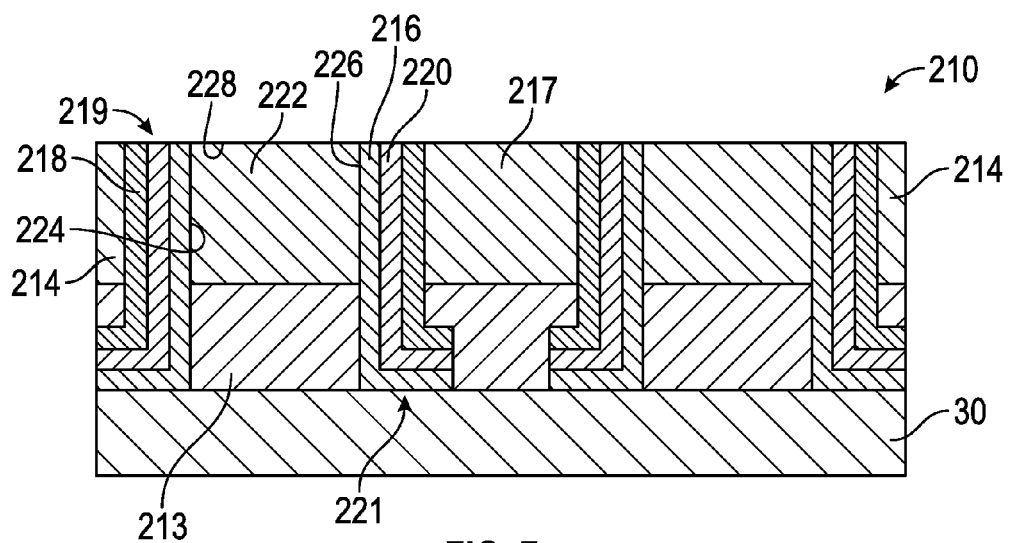
FIGS. 7-8(h) are schematic cross-sectional side views of a portion of a non-volatile RRAM crossbar device including two memory element and selector pairs disposed at crossbar junctions between a single bitline and two wordlines and a method of fabricating the same in accordance with the embodiment of FIG. 5.

Referring to FIGS. 5-7, another embodiment of a non-volatile RRAM crossbar device 210 will now be described. In this embodiment and as shown in FIG. 5, the non-volatile RRAM crossbar device 210 includes a crossbar array 211 that includes a bitline 213 and a wordline 214. In particular, in this embodiment, first wordlines 214 (i.e., "odd" wordlines) and second wordlines 217 (i.e., "even" wordlines) are formed and are employed to provide a two bit per cell structure. Referring to FIG. 5, in this embodiment, the device 210 includes a memory element layer 216 and a selector layer 218 disposed in overlying relationship on the first sidewall 224 of the bitline 213 and hardmask 222, and further disposed between the first bitline 213 and the first wordline 214, to form a first memory element and selector pair 219. Additionally, the memory element layer 216 and the selector layer 218 are disposed in overlying relationship on the second sidewall 226 of the bitline 213 and hardmask 222, and further disposed between the first bitline 213 and the second wordline 217, to form a second memory element and selector pair 221. An electrode layer 220 is disposed over the memory element layer 216, between the selector layer 218 and the memory element layer 216. Although in FIGS. 5 and 7 the memory element layer 216 is shown to be directly disposed over the first sidewall 224 with the electrode layer 220 and the selector layer 218 disposed over the memory element layer 216, it is to be appreciated that in other embodiments the order of stacking between the memory element layer 216, the electrode layer 220, and the selector layer 218 may be the same as that shown in FIGS. 1 and 3. As with the embodiment shown in FIG. 3, the selector layer 218 and the electrode layer 220 are discontinuous over a top surface 228 of the hardmask 222. However, unlike the configuration shown in FIGS. 1 and 3, in the embodiment shown in FIGS. 5 and 7, the memory element layer 216 is also discontinuous over the top surface 228 of the hardmask 222, thereby resulting in the first memory element and selector pair 219 and the second memory element and selector pair 221. With the memory element and selector pair 219 and the second memory element and selector pair 221 being formed in the embodiment of FIGS. 5-7, memory element density is effectively doubled over the memory element density of the embodiment shown in FIGS. 1-3. Further, solutions with maximizing surface area of the selector layer 218 are still provided in the embodiment of FIGS. 5-7 due to the presence of the hardmask 222 and formation of the memory element layer 216 and the selector layer 218 over the sidewalls 224, 226 of the bitline 213 and the hardmask 222.

Figure 8A:
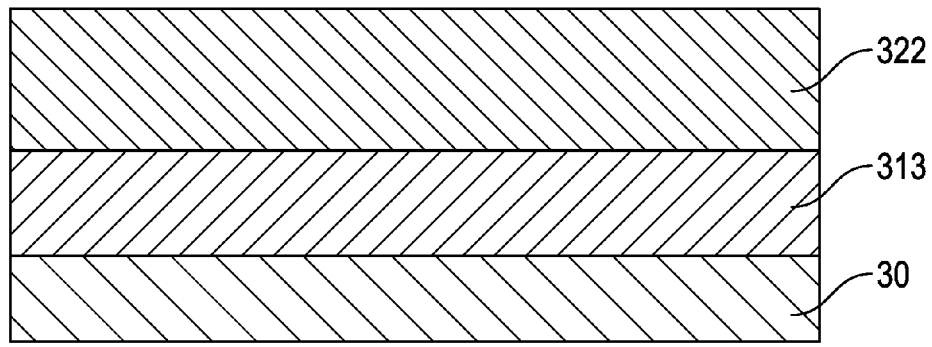
Figure 8B:
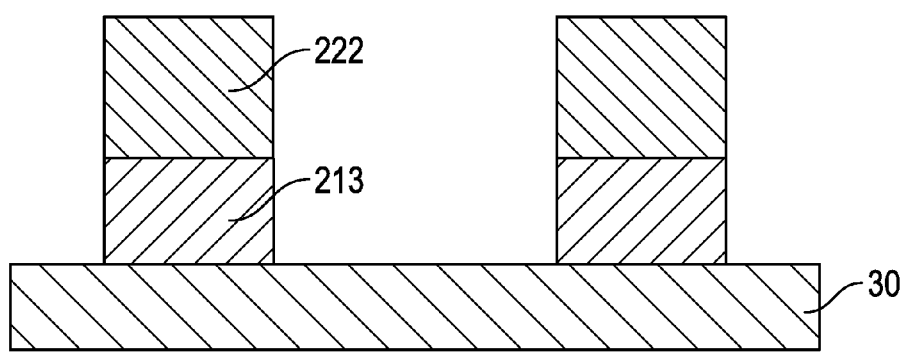
Figure 8C:
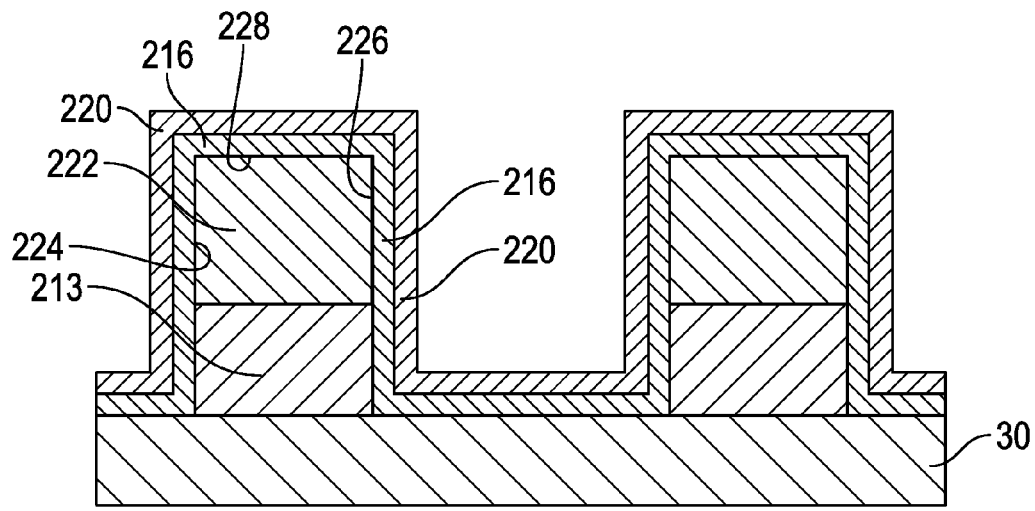
Figure 8D:
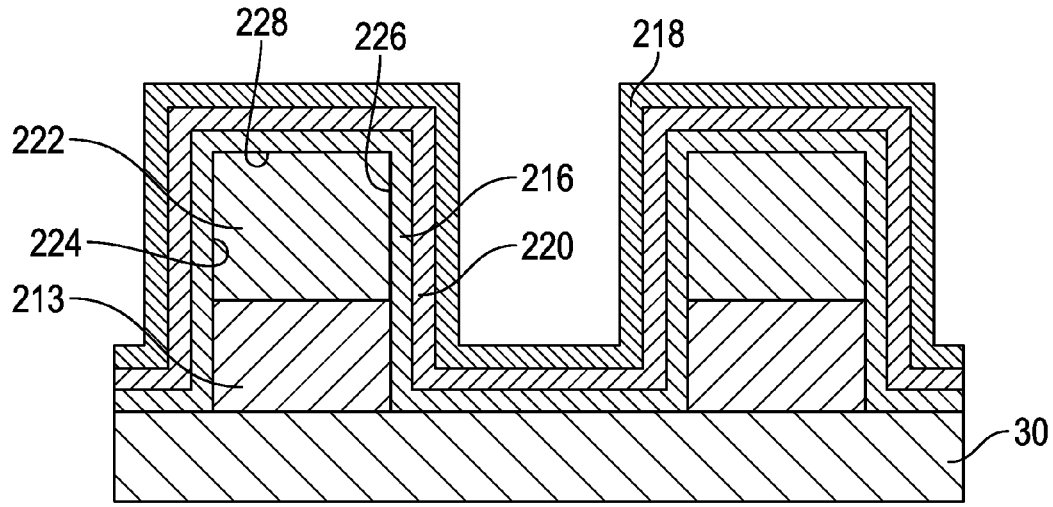
Figure 8E:
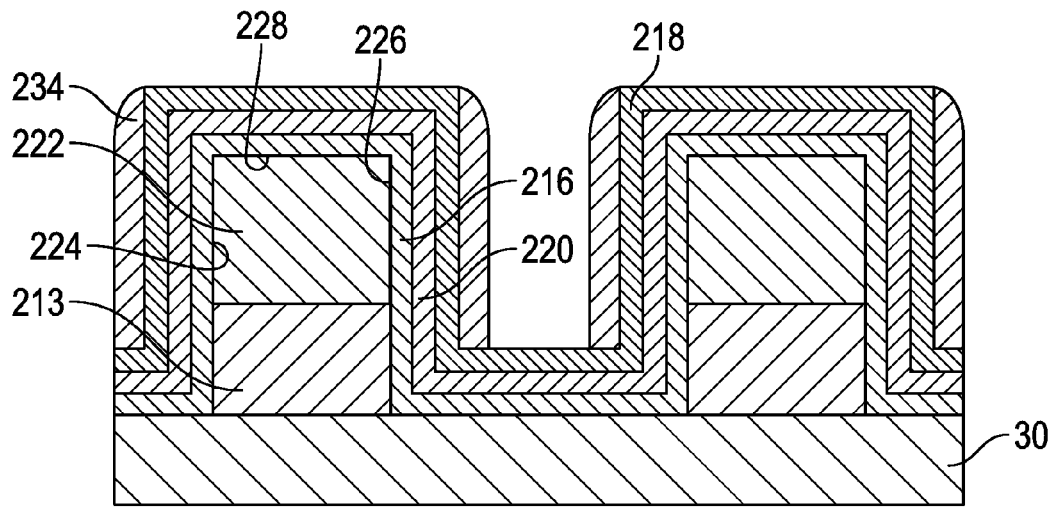
Figure 8F:
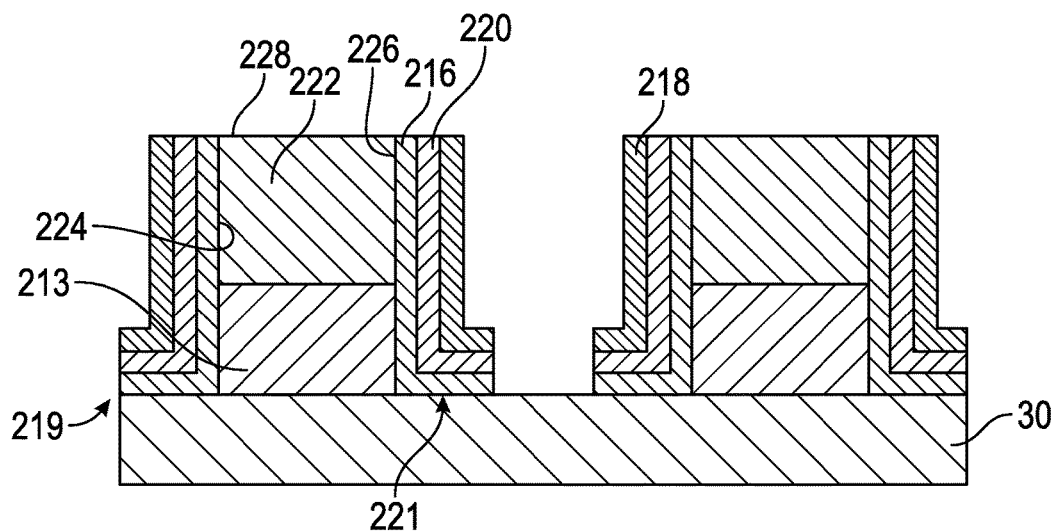
Figure 8G:
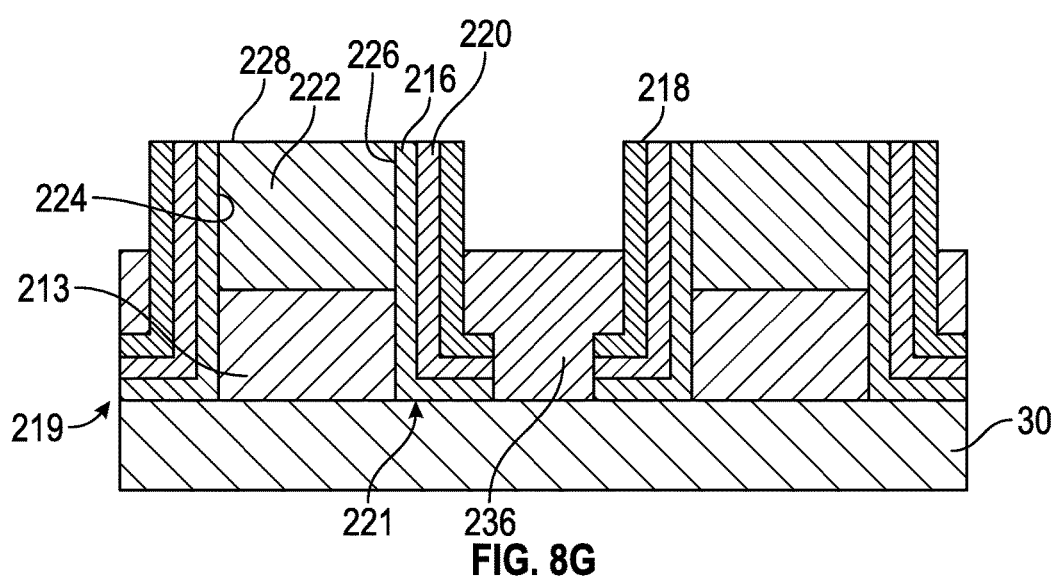
Figure 8H:
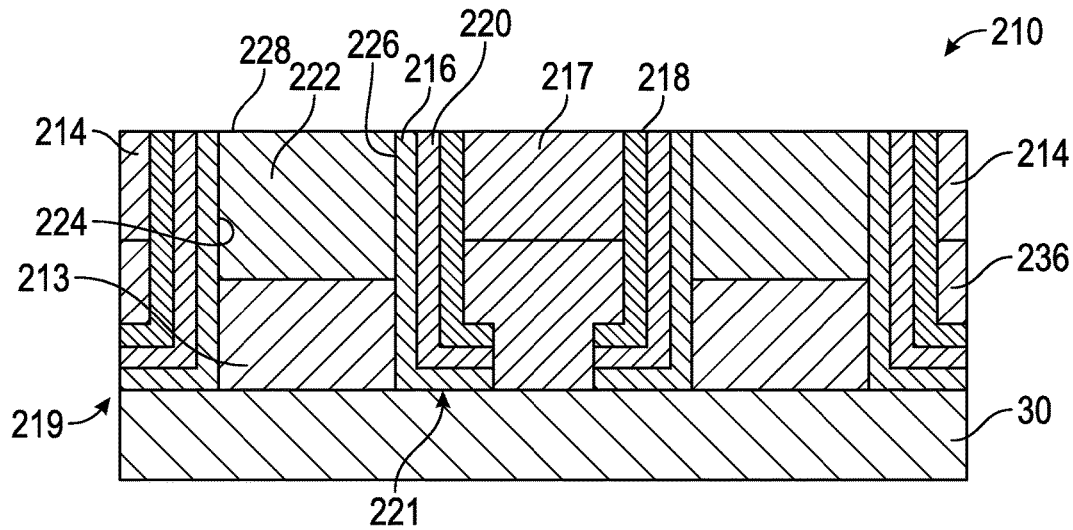

Referring to FIGS. 8(a)-8(h), a method of forming the non-volatile RRAM crossbar device 210 of FIGS. 5 and 7 is shown. The method is substantially similar to the method described above in reference to FIGS. 4(a)-4(h), with a few key distinctions. First, as described above, the order of forming the memory element layer 216, the selector layer 218, and the electrode layer 220 is different than the order described in FIGS. 4(a)-4(h). In this embodiment and as shown in FIG. 8(e), the memory element layer 216 is present prior to formation of sidewall spacers 234 and etching. As a result, the memory element layer 216 is etched from the top surface 228 of the hardmask 222 and is further etched from the space between sidewall spacers 34 of adjacent bitline 13 and hardmask 22. Also in this embodiment and as shown in FIG. 8(h), the first wordline 214 and the second wordline 217 are formed through blanket deposition of wordline material and planarization of the wordline material to remove wordline material from the top surface 228 of the hardmask 222 while leaving hardmask material over the second dielectric layer 236, thereby forming the first wordline 214 as part of a first RRAM cell in the first memory element and selector pair 219 and the second wordline 217 as part of a second RRAM cell in the second memory element and selector pair 221.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:
1. A non-volatile resistive random access memory crossbar device comprising:
   a crossbar array comprising a bitline and a wordline;
   a hardmask comprising dielectric material and disposed over the bitline, wherein the hardmask and the bitline comprise a first sidewall and wherein the hardmask and the bitline further comprise a second sidewall on an opposing side thereof from the first sidewall; and
   a memory element layer and a selector layer disposed in overlying relationship, wherein the memory element layer and the selector layer in overlying relationship are further disposed in overlying relationship on the first sidewall of the bitline and hardmask, wherein the memory element layer and the selector layer are further disposed in overlying relationship over the second sidewall of the bitline and hardmask, and wherein the memory element layer and the selector layer are further disposed between the bitline and the wordline, to form a first memory element and selector pair.

2. The non-volatile resistive random access memory crossbar device of claim 1, wherein the memory element layer is further disposed over a top surface of the hardmask.

3. The non-volatile resistive random access memory crossbar device of claim 2, wherein the memory element layer is continuous over the first sidewall, the top surface of the hardmask, and the second sidewall, and wherein the selector layer is discontinuous over the top surface of the hardmask.

4. The non-volatile resistive random access memory crossbar device of claim 1, wherein the memory element layer and the selector layer are discontinuous over the top surface of the hardmask with the memory element layer and the selector layer disposed in overlying relationship on the second sidewall of the bitline and hardmask forming a second memory element and selector pair.

5. The non-volatile resistive random access memory crossbar device of claim 4, wherein a first electrode layer is disposed over the memory element layer, between the selector layer and the memory element layer.

6. The non-volatile resistive random access memory crossbar device of claim 1, further comprising an electrode layer disposed over the selector layer, between the selector layer and the memory element layer.

7. The non-volatile resistive random access memory crossbar device of claim 1, wherein the memory element layer is a resistive switching layer formed from a transition metal oxide.

8. The non-volatile resistive random access memory crossbar device of claim 1, wherein the selector layer comprises a resistive layer of a diode.

9. A non-volatile resistive random access memory crossbar device comprising:
   a crossbar array comprising a first bitline, a first wordline, and a second wordline;
   a hardmask comprising dielectric material and disposed over the first bitline, wherein the hardmask and the first bitline comprise a first sidewall and a second sidewall on an opposing side of the hardmask and first bitline from the first sidewall;

a first memory element and selector pair disposed on the first sidewall of the first bitline and hardmask, and further disposed between the first bitline and the first wordline; and a second memory element and selector pair disposed on the second sidewall of the first bitline and hardmask, and further disposed between the first bitline and the second wordline.

10. A method of fabricating a non-volatile resistive random access memory crossbar device, wherein the method comprises:

patterning a bitline with an overlying hardmask over a first dielectric layer;

forming a memory element layer and a selector layer over a first sidewall of the bitline and hardmask to form a first memory element and selector pair, wherein the memory element layer and the selector layer are further formed over a second sidewall of the bitline and hardmask to form a second memory element and selector pair, wherein the second sidewall is on an opposing side of the bitline and hardmask from the first sidewall, wherein the memory element layer and the selector layer are in overlying relationship and are further disposed in overlying relationship on the first sidewall of the bitline and hardmask, and wherein the memory element layer and the selector layer are further disposed in overlying relationship over the second sidewall of the bitline and hardmask;

forming a second dielectric layer over the first dielectric layer and adjacent to the bitline and the memory element layer, provided that a portion of the memory element layer over the first sidewall remains exposed after forming the second dielectric layer; and forming a wordline over the over the second dielectric layer and the exposed portions of the memory element layer.

11. The method of claim 10, wherein the selector layer and a first electrode layer are selectively formed over the first sidewall and the second sidewall of the bitline and the hardmask structure.

12. The method of claim 11, wherein sidewall spacers are formed over the first electrode layer adjacent to the first sidewall and the second sidewall of adjacent bitline and hardmask structures, with spacing provided between sidewall spacers of adjacent bitline and hardmask structures.

13. The method of claim 12, further comprising etching the first electrode layer and the selector layer from between the sidewall spacers of the adjacent bitline and hardmask structures.

14. The method of claim 13, wherein forming the memory element layer comprises forming the memory element layer over the first electrode layer, the top surface of the hardmask, and over the first dielectric layer between the adjacent bitline and hardmask structures.

15. The method of claim 10, wherein the memory element layer is first formed over the first sidewall and the second sidewall followed by forming the selector layer and a first electrode layer over the memory element layer.

16. The method of claim 15, wherein sidewall spacers are formed over the first electrode layer adjacent to the first sidewall and the second sidewall of adjacent bitline and hardmask structures, with spacing provided between sidewall spacers of adjacent bitline and hardmask structures.

17. The method of claim 16, further comprising etching the first electrode layer, the selector layer, and the memory element layer from between the sidewall spacers of the adjacent bitline and hardmask structures.

18. The method of claim 17, wherein forming the wordline comprises depositing wordline material and planarizing the wordline material to remove the wordline material from the top surface of the hardmask while leaving hardmask material over the second dielectric layer.

* * * * *